United States Patent
Chao et al.

(10) Patent No.: US 11,309,858 B2
(45) Date of Patent: Apr. 19, 2022

(54) METHOD FOR INDUCING BRAINWAVES BY SOUND AND SOUND ADJUSTING DEVICE

(71) Applicant: PixArt Imaging Inc., Hsin-Chu County (TW)

(72) Inventors: Kuan-Li Chao, Taipei (TW); Kuo-Wei Kao, Taipei (TW); I-Ting Lee, Taipei (TW); Wei-Lin Chang, Taipei (TW); Wei-Ren Lan, Taipei (TW); Kuo-Ping Yang, Taipei (TW)

(73) Assignee: PixArt Imaging Inc., Hsin-Chu County (TW)

( * ) Notice: Subject to any disclaimer, the term of this patent is extended or adjusted under 35 U.S.C. 154(b) by 0 days.

(21) Appl. No.: 17/102,737

(22) Filed: Nov. 24, 2020

(65) Prior Publication Data

US 2021/0218380 A1  Jul. 15, 2021

(30) Foreign Application Priority Data

Jan. 14, 2020 (TW) .................................. 109101201

(51) Int. Cl.
*H03G 7/06* (2006.01)
*H04R 5/02* (2006.01)
*H04S 1/00* (2006.01)
*H04R 5/04* (2006.01)

(52) U.S. Cl.
CPC ............... *H03G 7/06* (2013.01); *H04R 5/02* (2013.01); *H04R 5/04* (2013.01); *H04S 1/007* (2013.01); *H04S 2400/13* (2013.01)

(58) Field of Classification Search
CPC combination set(s) only.
See application file for complete search history.

(56) References Cited

U.S. PATENT DOCUMENTS

| | | | |
|---|---|---|---|
| 2007/0222504 A1* | 9/2007 | Bates | H03F 1/305 330/9 |
| 2015/0245156 A1* | 8/2015 | Tsang | H04S 7/30 381/17 |
| 2017/0087367 A1* | 3/2017 | Weisend | A61B 6/037 |
| 2017/0173296 A1* | 6/2017 | Park | A61B 5/024 |
| 2019/0247662 A1* | 8/2019 | Poltroak | A61B 5/246 |
| 2020/0067344 A1* | 2/2020 | Orsini | H02J 13/00001 |
| 2020/0218226 A1* | 7/2020 | Tsai | G01D 5/2451 |

* cited by examiner

*Primary Examiner* — Duc Nguyen
*Assistant Examiner* — Assad Mohammed
(74) *Attorney, Agent, or Firm* — Bacon & Thomas, PLLC

(57) ABSTRACT

A method for inducing brain waves by sound has the following steps: receiving a first channel input signal and a second channel input signal; adjusting a volume gain of the first channel input signal to form a first channel output signal, wherein a format of the volume gain of the first channel output signal is a first wave format; adjusting a volume gain of the second channel input signal to form a second channel output signal, wherein a format of the volume gain of the second channel output signal is a second wave format, wherein there is a phase difference between the first wave format and the second wave format, wherein the formats of the first wave format and the second wave format are the same; outputting the first channel output signal to a first speaker; and outputting the second channel output signal to a second speaker.

12 Claims, 3 Drawing Sheets

METHOD FOR INDUCING BRAINWAVES BY SOUND AND SOUND ADJUSTING DEVICE

BACKGROUND OF THE INVENTION

1. Field of the Invention

The present invention relates to a method for inducing brainwaves by sound and a sound adjusting device, particularly to a method for inducing brainwaves by sound capable of outputting sounds that induce a listener's brain to generate brainwaves of a specific frequency and a sound adjusting device.

2. Description of the Related Art

Brainwave synchronization (brainwave entrainment) refers to the provision of periodic external stimuli, such as aural, visual or tactile stimuli. The brain naturally synchronizes the brainwave frequency with such periodic external stimuli. A common periodic auditory stimulus is, fir example, binaural beats. The binaural beat occurs when the two ears of the human body receive similar but different frequencies of sound and the sound waves are integrated in the brain to produce a third sound from a sound difference between the two ears, making people feel the beat of the third sound. For example, if the left ear receives sound waves of 124 Hz and the right ear receives sound waves of 114 Hz at the same time, the brain will generate a third sound beat of 10 Hz. Binaural beats were first discovered by German psychologist H. W. Dove in 1839. Many current studies have suggested that if the difference in the binaural sound frequencies falls in different frequency bands of the brainwaves, it can induce the brain to generate a corresponding brainwave frequency band. Common types of brainwaves are $\delta$ waves (the brainwave frequency is about 0.5 Hz to 4 Hz), $\theta$ waves (the brainwave frequency is about 4 Hz to 8 Hz), $\alpha$ waves (the brainwave frequency is about 8 Hz to 13 Hz) and $\beta$ waves (the brainwave frequency is about 14 Hz to 30 Hz).

However, the frequency of the music needs to be changed in order to generate binaural beats. Although it will induce a listener's brain resonance to change the brainwave frequency, this kind of music does not retain the pitch of the original music or provide the pleasure of listening to music. Therefore, it is necessary to provide a sound adjusting device having the function of inducing the brain resonance to change the brainwave frequency without changing the pitch of music.

SUMMARY OF THE INVENTION

It is a major objective of the present invention to provide a method for inducing brainwaves by sound capable of outputting sounds that induce a listener's brain to generate brainwaves of a specific frequency without changing the pitch of music.

It is another objective of the present invention to provide a sound adjusting device that outputs sounds that induce a listener's brain to generate brainwaves of a specific frequency without changing the pitch of music.

To achieve the above objectives, a method for inducing brainwaves by sound of the present invention is applied to a sound playing device. The sound playing device includes a processor and is signally connected to a speaker device. Specifically, the speaker device includes a first speaker and a second speaker. The method for inducing brainwaves by sound of the present invention includes the following steps: receiving a first channel input signal and a second channel input signal; adjusting a volume gain of the first channel input signal to form a first channel output signal, wherein a format of the volume gain of the first channel output signal is a first wave format; adjusting a volume gain of the second channel input signal to form a second channel output signal, wherein a format of the volume gain of the second channel output signal is a second wave format, wherein the type of the first wave format is the same as that of the second wave format; and outputting the first channel output signal to a first speaker and the second channel output signal to a speaker device such that the second channel output signal plays through the second speaker.

The present invention further provides a sound adjusting device signally connected to a speaker device. Specifically, the speaker device includes a first speaker and a second speaker. The sound adjusting device eludes a signal input terminal, a signal output terminal and a sound processing unit. The signal input terminal receives a first channel input signal and a second channel input signal. The sound processing unit is electrically connected to the signal input terminal and includes a sound adjustment module. Specifically, the sound adjustment module adjusts a volume gain of the first channel input signal to form a first channel output signal, wherein a format of the volume gain of the first channel output signal is a first wave format. The sound adjustment module adjusts a volume gain of the second channel input signal to form a second channel output signal, wherein a format of the volume gain of the second channel output signal is a second wave format, wherein the type of the first wave format is the same as that of the second wave format. The signal output terminal is electrically connected to the sound processing unit. The signal output terminal outputs the first channel output signal to the speaker device and plays it through the first speaker and outputs the second channel output signal to the speaker device and plays it through the second speaker.

The method for inducing brainwaves by sound and the sound adjusting device of the present invention still have the function of inducing the brain resonance to change the frequency of the brainwave without changing the pitch of music. This solves the problem existing in the prior art. In addition, it is generally considered that the necessary conditions for generating binaural sound waves for binaural beats are that the frequency itself is lower than 1500 Hz and that the frequency difference is less than 30 Hz; otherwise, it is difficult to feel the third sound. Compared with binaural beats, the special music and music frequency are selected as the audio source. The brainwave inducing sound of the present invention is not subject to the above-mentioned selection of music because its sound frequency does not need to be adjusted. In addition, as mentioned above, the difference in sound frequency between binaural beats must not be too large; otherwise, it is difficult for the listener to feel the third sound, and if the audio source is music, it will greatly affect the listener's listening experience. However, since the sound frequency of the brainwave inducing sound of the present application does not need to be adjusted, the range of the induced frequency is not limited, and the pitch is not affected.

DETAILED DESCRIPTION OF THE PREFERRED EMBODIMENT

Hereafter, the technical content of the present invention will be better understood with reference to preferred embodiments. Please first refer to FIG. 1 and FIG. 2, which illustrate a hardware architecture diagram of a sound adjusting device in an embodiment of the present invention and a schematic diagram of the volume gain output of a first channel output signal and a second channel output signal of the present invention.

Figure 1:
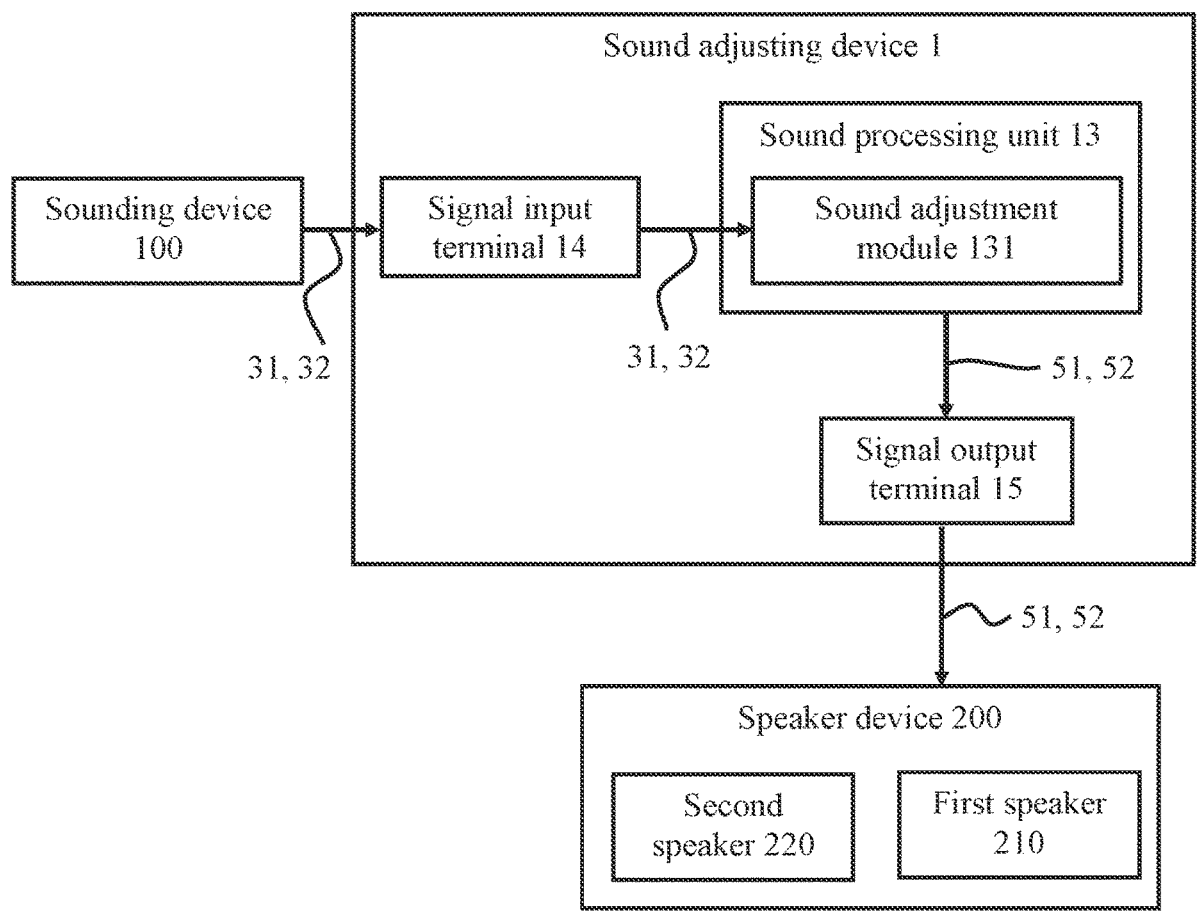
FIG. 1 is a hardware architecture diagram of a sound adjusting device in an embodiment of the present invention.

As shown in FIG. 1, in an embodiment of the present invention, a sound adjusting device 1 of the present invention is signally connected to a sounding device 100 and a speaker device 200. Specifically, the speaker device 200 includes a first speaker 210 and a second speaker 220. The sound adjusting device of the present invention 1 includes a sound processing unit 13, a signal input terminal 14 and a signal output terminal 15. The sound adjusting device 1 is used to adjust the first channel input signal 31 and the second channel input signal 32 input from the sounding device 100, and to output the adjusted first channel output signal 51 to the first speaker 210 for playback. The adjusted second channel output signal 52 is output to the second speaker 220 for playback, and thus a brainwave inducing sound effect is generated.

In an embodiment, the sounding device 100 can be a device that generates sound, such as a stereo, TV, cloud music server, or mobile phone. The audio source provided can include, but is not limited to, the Internet, a storage medium or microphone (not shown), but the present invention is not limited to the devices listed above. Additionally, in an embodiment, the sound adjusting device 1 can be a microprocessor chip provided on the sounding device 100 and communicate with the speaker device 200 in a wired or wireless manner, but the present invention is not limited thereto. In other embodiments, the sound adjusting device 1 may also be provided on the speaker device 200 and connected to the sounding device 100 in a wired or wireless manner. For example, the sound adjusting device 1 and the sounding device 100 may both be mobile phone modules, and the speaker device 200 may be a headset; or the sounding device 100 may be a mobile phone module, and the sound adjusting device 1 and the speaker device 200 may both be headphone modules.

Figure 2:
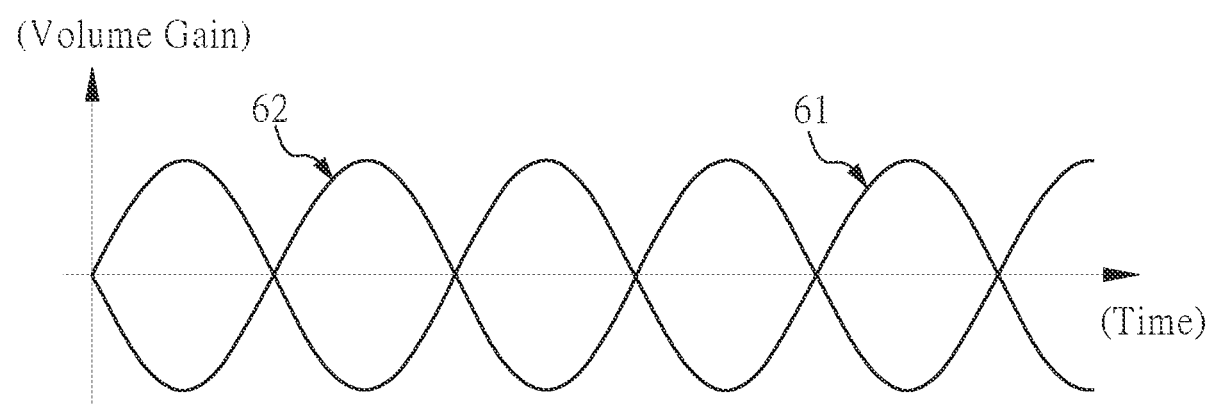
FIG. 2 is a schematic diagram of the volume gain output of a first channel output signal and a second channel output signal of the present invention.

In an embodiment of the present invention, as shown in FIG. 1, the signal input terminal 14 is connected with the sounding device 100 to obtain the first channel input signal 31 and the second channel input signal 32 provided by the sounding device 100. Specifically, the first channel input signal 31 is right channel stereo sound, and the second channel input signal 32 is left channel stereo sound. As shown in FIG. 1, in an embodiment of the present invention, the sound processing unit 13 is signally connected with the signal input terminal 14 and the signal output terminal 15. The sound processing unit 13 includes a sound adjustment module 131 (such as a gain amplifier) for adjusting a volume gain of the first channel input signal 31 to form a first channel output signal 51. Specifically, as shown in FIG. 2, a format of the volume gain of the first channel output signal 51 is a first wave format 61. The sound adjustment module 131 adjusts a volume gain of the second channel input signal 32 to form a second channel output signal 52. Specifically, as shown in FIG. 2, a format of the volume gain of the second channel output signal 52 is a second wave format 62, and the type of the first wave format 61 is the same as that of the second wave format 62. The signal output terminal 15 sends the first channel output signal 51 to the speaker device 200 and it is output through the first speaker 210 and sends the second channel output signal 52 to the speaker device 200 and it is output through the second speaker 220.

As shown in FIG. 2, in order to generate the brainwave inducing sound effect without affecting the user's listening quality and without changing the pitch of music, the first wave format 61 of the first channel output signal 51 and the second wave format 62 of the second channel output signal 52 are presented in the following five embodiments. Embodiment 1: A brainwave inducing sound at a specific frequency band of the sound signal is generated selectively. For example, the full frequency band of 20 Hz to 20,000 Hz, the low frequency band of 20 Hz to 160 Hz, the intermediate frequency band of 160 Hz to 2,560 Hz, the high frequency band of 2,560 Hz to 20,000 Hz or another specific frequency band is selected for volume gain adjustment. Embodiment 2: The types of volume gain variation waveform are the same, but they are not limited to a specific wave format. For example, the sound adjustment module 131 allows the first wave format 61 of the first channel output signal 51 and the second wave format 62 of the second channel output signal 52 to be the same wave format, such as a sine wave, a triangular wave, a square wave, a trapezoidal wave, or an asymmetric wave. Embodiment 3: It is ensured that there is a phase difference between the first wave format 61 and the second wave format 62. For example, the sound adjustment module 131 can have a Phase difference of 0° to 360° between the first wave format 61 of the first channel output signal 51 and the second wave format 62 of the second channel output signal 52 to generate a brainwave inducing sound effect. Embodiment 4: The sound adjustment module 131 can adjust the frequency of the first wave format 61 of the first channel output signal 51 to 0 Hz to 110,000 Hz and the frequency of the second wave format 61 of the second channel output signal 51 to 0 Hz to 10,000 Hz to generate a brainwave inducing sound effect. Also, the frequency adjustment of the first wave format and the second wave format need not be the same. Embodiment 5: The sound adjustment module 131 can adjust the volume gain of the first channel output signal 51 and the second channel output signal 52 to achieve the brainwave inducing sound effect. For example, the maximum volume gain of the first channel output signal 51 is M1, and the minimum volume gain of the first channel output signal 51 is M2, where $-200 \text{ dbFS} \leq \text{M1}-\text{M2} \leq 0 \text{ dbFS}$. The maximum volume gain of the second channel output signal 52 is M3, and the minimum volume gain of the second channel output signal 52 is M4, where $-200 \text{ dbFS} \leq \text{M3}-\text{M4} \leq 0 \text{ dbFS}$. Moreover, the volume gain of the first channel output signal 51 and the volume gain of the second channel output signal 52 need not be the same.

In an embodiment of the present invention, as shown in FIG. 1, the signal output terminal 15 is signally connected to the sound processing unit 13 and connected to the speaker device 200 in a wired or wireless manner. The signal output terminal 15 sends the first channel output signal 51 to the speaker device 200 and the first channel output signal 51 is output through first speaker 210. The signal output terminal 15 sends the second channel output signal 52 to the speaker device 200 and the second channel output signal 52 is output through the second speaker 220. It should be noted here that the sound adjustment module 131 of the present invention adjusts the volume gains of the first channel input signal 31 and the second channel input signal 32, not the frequencies of the first channel input signal 31 and the second channel input signal 32. Therefore, the sound adjusting device of the present invention can have the function of inducing the brain resonance to change the brainwave frequency without changing the pitch of music. This solves the problem existing in the prior art.

It should be noted that in addition to being configured as a hardware device, software program, firmware or a combination thereof, the above sound adjustment module 131 can also be configured as a circuit loop or other appropriate types; further, in addition to being able to be individually configured, each module can also be combined for configuration. A preferred embodiment is that the sound adjustment module 131 is a software program stored in a storage unit of a microprocessor (not shown), and a processing unit of the microprocessor (not shown) executes two modules to achieve the function of the present invention. Additionally, the preferred embodiments of the present invention described above are only illustrative. To avoid redundancy, not all the possible combinations of changes are documented in detail. However, it shall be understood by those skilled in the art that each of the modules or elements described above may not be necessary. For the implementation of the present invention, the present invention may also contain other detailed, conventional modules or elements. Each nodule or component is likely to be omitted or modified depending on variable needs, and other modules or elements may not necessarily exist between any two modules.

Figure 3:
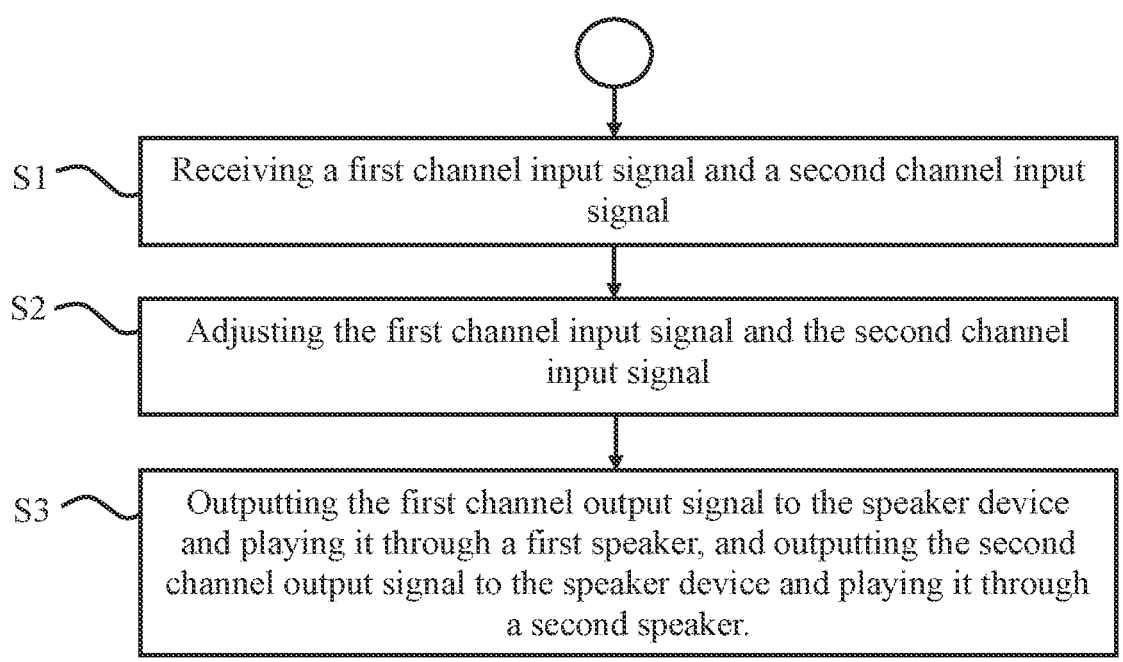
FIG. 3 is a flowchart showing steps of a method for inducing brainwaves by sound in an embodiment of the present invention.

Please refer to FIG. 1 to FIG. 3, wherein FIG. 3 is a flowchart showing steps of a method for inducing brainwaves by sound in an embodiment of the present invention. Hereafter, the steps shown in FIG. 3 gill be described below in conjunction with FIG. 1 and FIG. 2. It should be noted here that although the above sound adjusting device 1 is employed as an example to explain the sound adjustment r method of the present invention, the sound adjustment method of the present invention is not limited to a sound adjusting device 1 of the same structure described above.

As shown in FIG. 1, the sound adjusting device 1 of the present invention is signally connected to the sounding device 100 and the speaker device 200. Specifically, the speaker device 200 includes a first speaker 210 and a second speaker 220. The sound adjusting device 1 of the present invention includes a sound processing unit 13, a signal input terminal 14 and a signal output terminal 15. The sounding device 100 can be a device that generates sound, such as a stereo, TV, cloud music server, or mobile phone. The audio source provided can include, but is not limited to, the Internet, a storage medium or a microphone (not shown), but the present invention is not limited to the devices listed above. Additionally, in an embodiment, the sound adjusting device 1 can be a microprocessor chip provided on the sounding device 100 and can communicate with the speaker device 200 in a wired or wireless manner, but the present invention is not limited thereto. In other embodiments, the sound adjusting device 1 may also be provided on the speaker device 200 and connected to the sounding device 100 in a wired or wireless manner. For example, the sound adjusting device 1 and the sounding device 100 may both be mobile phone modules, and the speaker device 200 may be a headset, or the sounding device 100 may be a mobile phone module, aid the sound adjusting device 1 and the speaker device 200 may both be headphone modules.

Step S1: Receiving a First Channel Input Signal and a Second Channel Input Signal.

The signal input terminal 14 of the sound adjusting device 1 is connected with the sounding device 100 to obtain a first channel input signal 31 and a second channel input signal 32 provided by the sounding device 100. Specifically, the first channel input signal 31 is right channel stereo sound, and the second channel input signal 32 is left channel stereo sound.

Step S2: Adjusting the First Channel Input Signal and the Second Channel Input Signal.

As shown in FIG. 1, in an embodiment of the present invention, the sound processing unit 13 is signally connected to the signal input terminal 14 and the signal output terminal 15. The sound process unit 13 includes a sound adjustment module 131 for adjusting a volume gain of the first channel input signal 31 to form a first channel output signal 51. Specifically, as shown in FIG. 2, a format of the volume gain of the first channel output signal 51 is a first wave format 61. The sound adjustment module adjusts a volume gain of the second channel input signal 32 to form a second channel output signal 52. Specifically, as shown in FIG. 2, a format of the volume gain of the second channel output signal 52 is a second wave format 62, and the type of the first wave format 61 is the same as that of the second wave format 62.

As shown in FIG. 2, in order to generate the brainwave inducing sound effect without affecting the user's listening quality, the first wave format 61 of the first channel output signal 51 and the second wave format 62 of the second channel output signal 52 are presented in the following five embodiments. Embodiment 1: A brainwave inducing sound at a specific frequency band of the sound signal is selectively generated. For example, the full frequency band of 20 Hz to 20,000 Hz, the low frequency band of 20 Hz to 160 Hz, the intermediate frequency band of 160 Hz to 2,560 Hz, the high frequency band of 2,560 Hz to 20,000 Hz or another specific frequency band is selected for volume gain adjustment. Embodiment 2: The type of volume gain variation waveform is the same, but it is not limited to a specific wave format. For example, the sound adjustment module 131 allows the first wave format 61 of the first channel output signal 51 and the second wave format 62 of the second channel output signal 52 to be the same wave format, such as a sine wave, a triangular wave, a square wave, a trapezoidal wave, or an asymmetric wave. Embodiment 3: It is ensured that there is a phase difference between the first wave format 61 and the second wave format 62. For example, the sound adjustment module 131 can have a phase difference of 0° to 360° between the first wave format 61 of the first channel output signal 51 and the second wave format 62 of the second channel output signal 52 to generate a brainwave inducing sound effect. Embodiment 4: The sound adjustment module 131 can adjust the frequency of the first wave format 61 of the first channel output signal 51 to 0 Hz to 10,000 Hz and can adjust the frequency of the second wave format 61 of the second channel output signal 51 to 0 Hz to 10,000 Hz to generate a brainwave inducing sound effect. Embodiment 5: The sound adjustment module 131 can adjust the volume gain of the first channel output signal 51 and the volume gain of the second channel output signal 52 to achieve the brainwave inducing sound effect. For example, the maximum volume gain of the first channel output signal 51 is M1, and the minimum volume gain of the first channel output signal 51 is M2, where −200 dbFS≤M1−M2≤0 dbFS. The maximum volume gain of the second channel output signal 52 is M1, and the minimum volume gain of the second channel output signal 52 is M2, where −200 dbFS≤M1−M2≤0 dbFS.

Step S3: Outputting the First Channel Output Signal to the Speaker Device and Playing it Through the First Speaker, and Outputting the Second Channel Output Signal to the Speaker Device and Playing it Through the Second Speaker.

In an embodiment of the present invention, as shown in FIG. 1, the signal output terminal 15 is signally connected to the sound processing unit 13 and connected to the speaker device 200 in a wired or wireless manner. The signal output terminal 15 outputs the first channel output signal 51 to the speaker device 200 and plays it through the first speaker 210. Also, the signal output terminal 15 outputs the second channel output signal 52 to the speaker device 200 and plays it through the second speaker 220.

It should be noted here that the sound adjustment method of the present invention adjusts the volume gain of the first channel input signal 31 and the second channel input signal 32, not the frequency of the first channel input signal 31 and the second channel input signal 32. Therefore, the sound adjusting device of the present invention can have the function of inducing the brain resonance to change the brainwave frequency without changing the pitch of music. This solves the problem existing in the prior art.

It should be noted that the embodiments of the present invention described above are only illustrative. To avoid redundancy, not all possible combinations of changes are documented in detail. However, it shall be understood by those skilled in the art that each of the modules or elements described above may not be necessary. For the implementation of the present invention, the present invention may also contain other detailed, conventional nodules or elements. Each module or component is likely to be omitted or modified depending on variable needs. Other modules or elements may not necessarily exist between any two modules.

What is claimed is:

1. A brainwave induced sound generating method, applied to a sound adjusting device, the sound adjusting device having a processor, and being signally connected to a speaker device, the speaker device comprising a first speaker and a second speaker, the method comprising the steps of:
    receiving a first channel input signal and a second channel input signal;
    adjusting a volume gain of the first channel input signal to form a first channel output signal, wherein a formal of the volume gain of the first channel output signal is in a first wave format;
    adjusting a volume gain of the second channel input signal to form a second channel output signal, wherein a formal of the volume gain of the second channel output signal is in a second wave format, wherein the type of the first wave format is the same as that of the second wave format; and
    outputting the first channel output signal to a first speaker, and outputting the second channel output signal to the speaker device and playing through the second speaker, wherein a maximum of the volume gain of the first channel output signal is M1, a minimum of the volume gain of the first channel output signal is M2, and $-200 \text{ dbFS} \leq M1-M2 \leq 0 \text{ dbFS}$; the maximum of the volume gain of the second channel output signal is M1, the minimum of the volume gain of the second channel output signal is M2, and $-200 \text{ dbFS} \leq M1-M2 \leq 0 \text{ dbFS}$.

2. The brainwave induced sound generating method as claimed in claim 1, wherein the method of adjusting the volume gain of the first channel input signal and the volume gain of the second channel input signal is: selecting a specific frequency band to generate brainwave induced sound for volume gain adjustment, where the specific frequency band includes the full frequency 20 Hz to 20000 Hz, the low frequency 20 Hz to 160 Hz, the intermediate frequency 160 Hz to 2560 Hz, the high frequency 2560 Hz to 20000 Hz or other specific frequency bands.

3. The brainwave induced sound generating method as claimed in claim 1, wherein the first wave format and the second wave format comprise sine wave, triangle wave, square wave, trapezoidal wave, asymmetric wave and other wave formats.

4. The brainwave induced sound generating method as claimed in claim 1, wherein there is a phase difference between the first wave format and the second wave format.

5. The brainwave induced sound generating method as claimed in claim 4, wherein the phase difference is 0° to 360°.

6. The brainwave induced sound generating method as claimed in claim 4, wherein the frequency range of the first wave format is between 0 Hz and 10000 Hz, and the frequency range of the second wave format is between 0 Hz and 10,000 Hz.

7. A sound adjusting device, which is signally connected with a speaker device, wherein the speaker device comprising a first speaker and a second speaker, the sound adjusting device comprising:
    a signal input terminal, used for receiving first channel input signal and a second channel input signal;
    a sound processing unit, which is electrically connected to the signal input terminal, the sound processing unit comprising:
    a sound adjustment module, which is used for adjusting a volume gain of the first channel input signal to form a first channel output signal, wherein a formal of the volume gain of the first channel output signal is in a first wave format; the sound adjustment module adjusting a volume gain of the second channel input signal to form a second channel output signal, wherein a formal of the volume gain of the second channel output signal is in a second wave format, wherein the type of the first wave format is the same as that of the second wave format; and
    a signal output terminal, which is electrically connected to the sound processing unit for outputting the first channel output signal to the speaker device and playing through the first speaker, and outputting the second channel output signal to the speaker device and playing through the second speaker, wherein a maximum of the volume gain of the first channel output signal is M1, a minimum of the volume gain of the first channel output signal is M2, and $-200 \text{ dbFS} \leq M1-M2 \leq 0 \text{ dbFS}$; the maximum of the volume gain of the second channel output signal is M1, the minimum of the volume gain of the second channel output signal is M2, and $-200 \text{ dbFS} \leq M1-M2 \leq 0 \text{ dbFS}$.

8. The sound adjusting device as claimed in claim 7, wherein the method of adjusting the volume gain of the first channel input signal and the volume gain of the second channel input signal is: selecting a specific frequency band to generate brainwave induced sound for volume gain adjustment, such as selecting the full frequency 20 Hz to 20000 Hz, the low frequency 20 Hz to 160 Hz, the intermediate frequency 160 Hz to 2560 Hz, the high frequency 2560 Hz to 20000 Hz or other specific frequency bands.

9. The sound adjusting device as claimed in claim 7, wherein the first wave format and the second wave format comprise sine wave, triangle wave, square wave, trapezoidal wave, asymmetric wave and other wave formats.

10. The sound adjusting device as claimed in claim 7, wherein there is a phase difference between the first wave format and the second wave format.

11. The sound playing device as claimed in claim 10, wherein the phase difference is 0° to 360°.

12. The sound adjusting device as claimed in claim 7, wherein the frequency of the first wave format is between 0 Hz and 10,000 Hz, and the frequency of the second wave format is between 0 Hz and 10,000 Hz.

\* \* \* \* \*